United States Patent
Wang et al.

(10) Patent No.: US 7,525,303 B2
(45) Date of Patent: Apr. 28, 2009

(54) AUTOMATIC TESTING APPARATUS AND METHOD

(75) Inventors: Chuan-Bang Wang, Shenzhen (CN); Yu-Ping Wu, Shenzhen (CN); Yan-Kai Zhang, Shenzhen (CN); Jun She, Shenzhen (CN)

(73) Assignees: Innocom Technology (Shenzhen) Co., Ltd., Shenzhen, Guangdong Province (CN); Innolux Display Corp., Miao-Li County (TW)

( * ) Notice: Subject to any disclaimer, the term of this patent is extended or adjusted under 35 U.S.C. 154(b) by 254 days.

(21) Appl. No.: 11/451,184

(22) Filed: Jun. 12, 2006

(65) Prior Publication Data

US 2006/0279307 A1    Dec. 14, 2006

(30) Foreign Application Priority Data

Jun. 10, 2005    (TW)    .............................. 94119220 A

(51) Int. Cl.
*G01R 31/28*    (2006.01)
(52) U.S. Cl. .................................................. 324/158.1
(58) Field of Classification Search .................. 324/770
See application file for complete search history.

(56) References Cited

U.S. PATENT DOCUMENTS

| | | | |
|---|---|---|---|
| 4,230,985 A * | 10/1980 | Matrone et al. | 324/755 |
| 5,546,405 A * | 8/1996 | Golla | 714/724 |
| 5,561,968 A | 10/1996 | Palmer | |
| 7,046,020 B2 * | 5/2006 | LaMeres et al. | 324/754 |
| 7,157,929 B1 * | 1/2007 | Kuo et al. | 324/770 |

* cited by examiner

*Primary Examiner*—Ha Tran T Nguyen
*Assistant Examiner*—Roberto Velez
(74) *Attorney, Agent, or Firm*—Wei Te Chung

(57) ABSTRACT

An automatic testing apparatus (200) includes a transmission floor (210), a board (220), a stopping unit (230), and a testing device (260) beside the transmission floor. The transmission floor includes a plurality of rollers (211) positioned at two sides thereof. The board positioned on the rollers includes an I/O (input/output) circuit (222) and a first connector (265) electrically connected to the I/O circuit. The testing device includes a second connector (225) matchable with the first connector. The I/O circuit is used to electrically connect to an electronic device to be tested, such as an LCD (280). The stopping unit is positioned at the transmission floor for stopping the board moving. An automatic testing method using the automatic testing apparatus for testing an electronic device is also provided. The efficiency of the automatic testing apparatus is high.

5 Claims, 2 Drawing Sheets

AUTOMATIC TESTING APPARATUS AND METHOD

FIELD OF THE INVENTION

The present invention relates a testing apparatus and method typically used in a liquid crystal display (LCD) testing line.

GENERAL BACKGROUND

An LCD has the advantages of portability, low power consumption, and low radiation, and has been widely used in various portable information products such as notebooks, personal digital assistants (PDAs), video cameras and the like. Furthermore, the LCD is considered by many to have the potential to completely replace CRT (cathode ray tube) monitors and televisions.

In order to ensure the quality of newly manufactured LCDs, a series of tests for checking the functions of the LCDs must be performed before the LCDs leave the factory. Generally, a plurality of testing apparatuses are needed for different tests, such as a contrast ratio test, a color quality test, and so on.

FIG. 2 is an isometric view of part of a typical testing apparatus used in an LCD testing line in a factory, together with two LCDs positioned thereon. The testing apparatus 100 includes a transmission floor 110 having a plurality of rollers 111 positioned at two parallel long sides thereof, a plurality of boards 120, 121 positioned on the rollers 111, a plurality of stopping units 130 positioned at a middle part of the transmission floor 110, a plurality of buttons 131 used to control the stopping units 130, and a plurality of testing devices 160 (only one shown) positioned beside the transmission floor 111. Each testing device 160 includes a computer 162, a display device 164, and an input/output (I/O) circuit 165. The I/O circuit 165 includes a video signal I/O port, an audio signal I/O port, and a USB (universal serial bus) I/O port.

The boards 120, 121 can slide along the transmission floor 110 at a predetermined speed, and are provided for carrying products such as LCDs 180 to be tested. Each LCD 180 includes a video signal I/O port, an audio signal I/O port, and a USB I/O port. The LCD 180 is also provided with three leads corresponding to the three ports, to enable connection between the ports of the LCD 180 and the corresponding ports of any of the testing devices 160.

The stopping units 130 can be raised in order to stop the respective boards 120, 121, and also can be lowered under the boards 120, 121 in order to allow the boards 120, 121 to slide along to respective next testing devices 160 (only one shown). Each stopping unit 130 is driven by an electric motor (not shown) or a compressed air driving device (not shown). When an operator presses a corresponding one of the buttons 131, an electrical signal is generated by an external circuit (not shown) and is applied to drive the electric motor or the compressed air driving device. Then the stopping unit 130 is lowered under the corresponding board 120 or 121. Otherwise, if the button 131 is not pressed, the stopping unit 130 stays in a raised position to stop the corresponding board 120 or 121.

Operation of the testing apparatus 100 is described in detail as follows. After the LCD 180 on the board 121 arrives at a location corresponding to the testing device 160 shown and stops moving, an operator connects the LCD 180 to the I/O circuit 165 through one of the video signal I/O port, the audio signal I/O port, and the USB I/O port of the board 121. Then the testing device 160 performs a test procedure to check one of the functions of the LCD 180, such as a contrast ratio of the LCD 180.

When the function test is finished, the operator disconnects the LCD 180 from the corresponding video signal I/O port, audio signal I/O port or USB I/O port of the board 121. The operator then presses the corresponding button 131, so that the board 121 having the LCD 180 thereon can move to a next testing device 160 (not shown) in order to check other functions of the LCD 180. Other functions tested may include color quality of the LCD 180, and so on.

As described above, before the testing device 160 performs a test procedure to check one of the functions of the corresponding LCD 180, the operator needs to connect the LCD 180 to the I/O circuit 165 of the testing device 160 through one of the video signal I/O port, the audio signal I/O port, and the USB I/O port of the board 120. Furthermore, after the function test is finished, the operator needs to disconnect the LCD 180 from the I/O circuit 165. Then the board 121 having the LCD 180 thereon can move to a next testing device 160 (not shown) in order to check another function of the LCD 180. Thus, before the next testing device 160 (not shown) performs a test procedure to check the other function of the LCD 180, an operator needs to connect the corresponding LCD 180 to the I/O circuit 165 of the testing device 160 (not shown). After the other function test is finished, the operator needs to disconnect the LCD 180 from the I/O circuit 165. These repeated manual connection and disconnection procedures for checking various functions of the LCD 180 at each of the testing devices 160 are time consuming, and are subject to human error. As a result, the efficiency of the testing apparatus 100 is limited.

It is desired to provide an automatic testing apparatus which overcomes the above-described deficiencies.

SUMMARY

An automatic testing apparatus includes a transmission floor, a board, a stopping unit, and a testing device beside the transmission floor. The transmission floor includes a plurality of rollers positioned at two sides thereof. The board positioned on the rollers includes an I/O circuit and a first connector electrically connected to the I/O circuit. The testing device includes a second connector matchable with the first connector. The I/O circuit is used to electrically connect to an electronic device to be tested, such as an LCD. The stopping unit is positioned at the transmission floor for stopping the board moving. An automatic testing method using the automatic testing apparatus for testing an electronic device is also provided.

Advantages and novel features of the above-described testing apparatus will become more apparent from the following detailed description when taken in conjunction with the accompanying drawings.

DETAILED DESCRIPTION OF PREFERRED EMBODIMENTS

Reference will now be made to the drawings to describe the present invention in detail.

Figure 1:
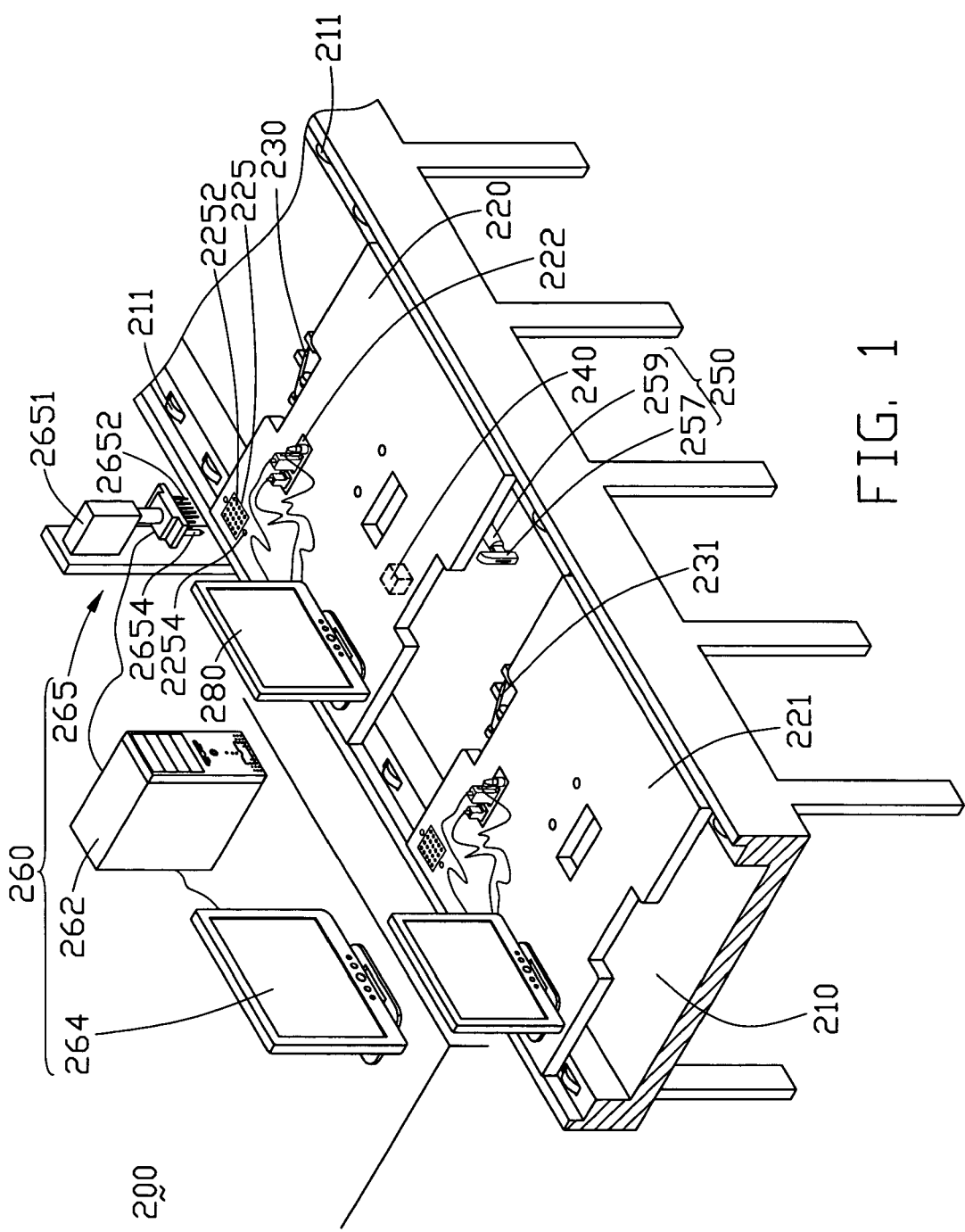
FIG. 1 is an isometric view of part of an automatic testing apparatus used in an LCD testing line in a factory according to a preferred embodiment of the present invention, together with two LCDs positioned thereon.
Figure 2:
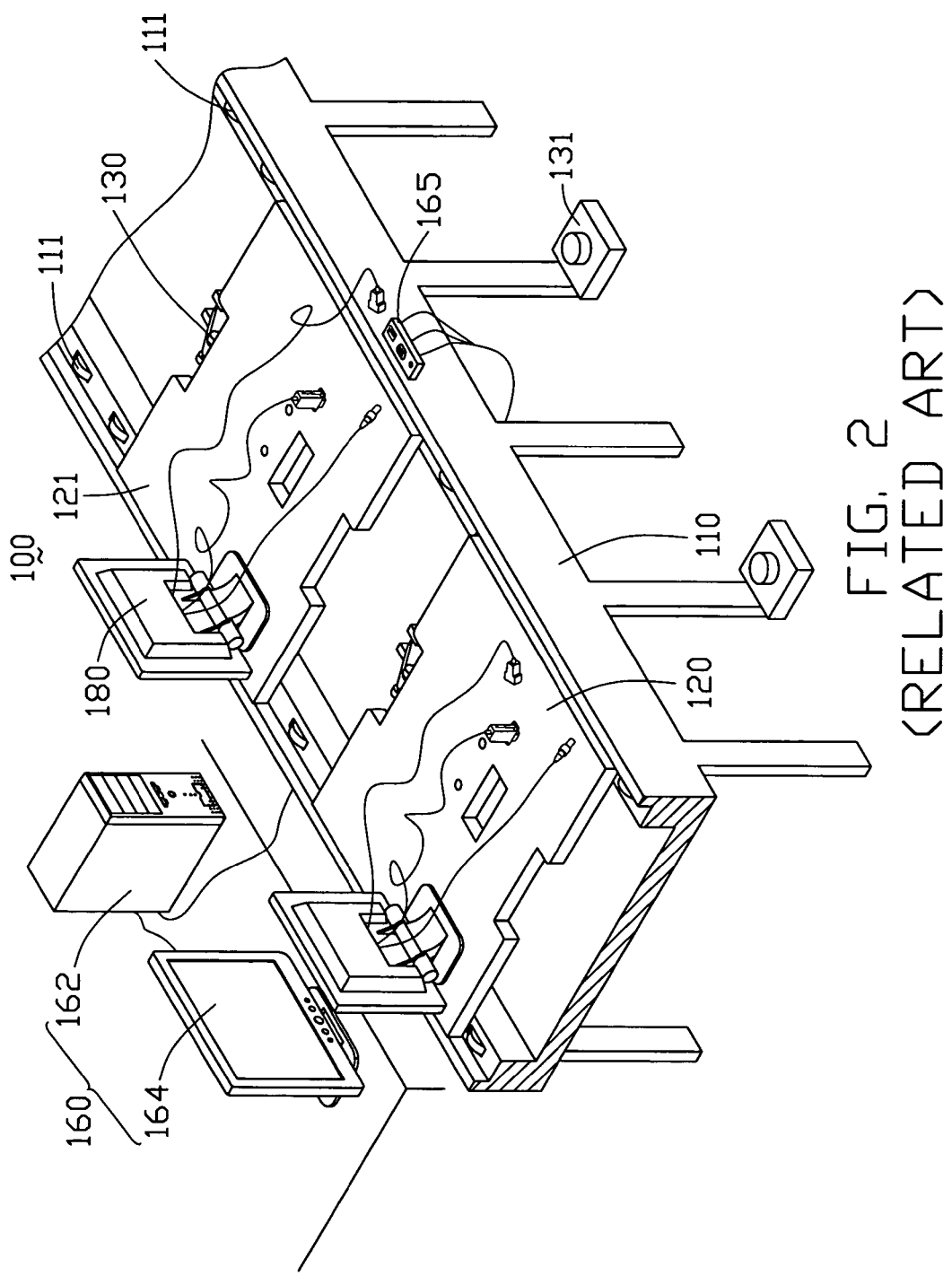
FIG. 2 is an isometric view of part of a typical testing apparatus used in an LCD testing line in a factory, together with two LCDs positioned thereon.

Referring to FIG. 1, an automatic testing apparatus 200 typically used in an LCD testing line according to a preferred embodiment of the present invention includes a transmission floor 210 having a plurality of rollers 211 positioned at two parallel long sides thereof, a plurality of boards 220, 221 positioned on the rollers 211 for carrying LCDs 280, a first stopping unit 230 positioned at a middle part of the transmission floor 210, a second stopping unit 231 positioned at a middle part of the transmission floor 210 a distance from the first stopping unit 230, a plurality of detecting units 240 (only one shown), a plurality of coarse positioning mechanisms 250 (only one shown), a plurality of fine positioning mechanisms (not labeled), and a plurality of testing devices 260 (only one shown) positioned beside the transmission floor 210. The detecting unit 240 shown (in phantom) is positioned between the first stopping unit 230 and the second stopping unit 231.

Each of the boards 220, 221 includes an I/O circuit 222 for electrically connecting to the LCD 280 positioned thereon, and a first connector 225 electrically connected to the I/O circuit 222. The first connector 225 is located on a lateral side portion of the respective board 220, 221. In the illustrated embodiment, the first connector 225 is located on a corner portion of the respective board 220, 221. The first connector 225 includes a plurality of metal pads 2252 arranged in a matrix. Each of the metal pads 2252 is typically circular or square. The I/O circuit 222 includes a video signal I/O port, an audio signal I/O port, and a USB I/O port. The I/O circuit 222 is used to electrically connect to the LCD 280. That is, the LCD 280 typically includes a video signal I/O port, an audio signal I/O port, and a USB I/O port. Three leads (not labeled) are used to connect the ports of the LCD 280 to the corresponding ports of the I/O circuit 222.

Each of the detecting units 240 positioned under the boards 220, 221 generates a detecting signal according to the position of the respective board 220, 221, and transmits the detecting signal to the testing device 260. A distance between the detecting unit 240 shown and the first stopping unit 230 is shorter than a corresponding width of each of the boards 220, 221. The detecting units 240 can for example be optical sensors.

The first stopping unit 230 and the second stopping unit 231 are used to stop the boards 220, 221 from moving along the transmission floor 210. The stopping units 231, 230 can be raised in order to prevent the boards 220, 221 from moving, and also can be lowered under the boards 220, 221 in order to allow the boards 220, 221 to slide along to respective next testing devices 260 (only one shown). The stopping units 230, 231 are driven by an electric motor (not shown) or a compressed air driving device (not shown). The actions of the stopping units 230, 231 are controlled by the corresponding testing device 260, which drives the electric motor or the compressed air driving device according to a corresponding received detecting signal.

Each testing device 260 includes a computer 262, a display 264, and a second connector 265. In the illustrated embodiment, the second connector 265 includes a tower (not labeled) fixed beside the transmission floor 210, and a first air driven device 2651. The first air driven device 2651 includes a vertically movable piston (not labeled), and a base plate (not labeled) fixed to a bottom of the piston. Two positioning posts 2654 are fixed on a bottom of the base plate, and a plurality of metal probes 2652 is also fixed on the bottom of the base plate. The metal probes 2652 are arranged in a matrix corresponding with that of the metal pads 2252 of the first connector 225 of each of the boards 220, 221. The metal probes 2652 all have a same length. The piston of the first air driven device 2651 can move up and down above the metal pads 2252 of the corresponding first connector 225.

When the piston of the first air driven device 2651 moves down, the metal probes 2652 move down to connect with the corresponding metal pads 2252 of the first connector 225. Thus, a plurality of signal channels between the first connector 225 and the second connector 265 is established. When the piston of the first air driven device 2651 moves up, the metal probes 2652 move up and disconnect from the corresponding metal pads 2252 of the first connector 225. The movement of the piston of the first air driven device 2651 is controlled by the computer 262 of the testing device 260 according to a corresponding received detecting signal. The metal probes 2652 of the second connector 265 can be configured to be resilient, to ensure that good one-to-one contact between all the probes 2652 and all the metal pads 2252 is achieved. The computer 262 is used to perform a procedure for checking one of the functions of the LCD 280 when the second connector 265 is electrically connected to the first connector 225. After the procedure for checking the LCD 280 is finished, the computer 262 generates a testing result. The movements of the piston of the first air driven device 2651 and the stopping units 230, 231 are all controlled by the computer 262 according to the testing result. The display device 264 is used to show a status of the procedure and the testing result.

In the illustrated embodiment, each coarse positioning mechanism 250 includes a second air driven device 259. The second air driven device 259 includes a horizontally movable piston (not labeled), and a positioning head 257 fixed to a distal end of the piston. The coarse positioning mechanism 250 shown is positioned between the first stopping unit 230 and the second stopping unit 231. A distance between the positioning head 257 of the coarse positioning mechanism 250 and the first stopping unit 230 is greater than a corresponding width of each of the boards 220, 221. As shown, the positioning head 259 can move and hold the board 220 in position in cooperation with the first stopping unit 230. The movement of the piston of the second air driven device 259 is controlled by the computer 262 according to the received detecting signal and the testing result.

Each fine positioning mechanism (not labeled) includes the two positioning posts 2654 of a respective second connector 265, and two positioning holes 2254 defined in a respective board 220, 221. The positioning posts 2654 are cylindrical with tapered bottom ends, and the positioning holes 2254 are circular. The positioning posts 2654 are located at two opposite sides of the probes 2652 respectively. The positioning holes 2254 are located at two opposite sides of the first connector 225 of the board 220 (221) respectively, corresponding to the positioning posts 2654. A diameter of each positioning hole 2254 is slightly greater than a diameter of each positioning post 2654. Each positioning post 2654 is longer than the metal probes 2652. Thus the positioning posts 2654 engage in the positioning holes 2254 before the metal probes 2652 of the second connector 265 make contact with the metal pads 2252 of the first connector 225. Accordingly, the fine positioning mechanism carries out the function of accurately adjusting the position of the second connector 265 relative to the first connector 225.

An exemplary testing method using the automatic testing apparatus 200 includes the following steps:

1) Loading an LCD 280 onto the board 220 by an operator.
2) Respectively connecting the video signal I/O port, the audio signal I/O port, and the USB I/O port of the LCD 280 to the video signal I/O port, the audio signal I/O port and the USB I/O port of the I/O circuit 222 by the operator.
3) Moving the board 220 along the transmission floor 210 at a predetermined speed by the rollers 211.
4) Stopping the board 220 by the first stopping unit 230 when the board 220 arrives at a location corresponding to the location of the testing device 260 shown.
5) Generating a detecting signal by the detecting unit 240 according to the position of the board 220, and transmitting the detecting signal to the testing device 260.
6) Holding the board 220 by the coarse positioning mechanism 250 in cooperation with the stopping unit 230.
7) Moving the piston of the first air driven device 2651 of the second connector 265 of the testing device 260 down so that the positioning posts 2654 of the second connector 265 engage in the positioning holes 2254 of the board 220, the metal probes 2652 of the second connector 265 connect with the corresponding metal pads 2252 of the first connector 225 of the board 220, and a plurality of signal channels from the LCD 280 to the testing device 260 is formed, the movement of the piston of the first air driven device 2651 being controlled by the testing device 260.
8) Performing a function test to check one of the functions of the LCD 280 (such as a contrast ratio of the LCD 280), by the testing device 260.
9) Moving the piston of the first air driven device 2651 of the second connector 265 up after the test procedure is finished, so that the metal probes 2652 of the second connector 265 disconnect from the metal pads 2252 of the first connector 225.
10) Moving the board 220 along the transmission floor 210 at a predetermined speed by the rollers 211 to a next testing device 260 (not shown).
11) Repeating the equivalent of steps 4-9 in the order described above in order to perform another function test on the LCD 280.

Unlike with a conventional testing apparatus, when a function test by any one of the testing devices 260 is finished, the second connector 265 is automatically disconnected from the first connector 225, and the board 220 is automatically moved from the present testing device 260 to a next testing device 260 for checking of another function of the LCD 280. Thus there is no need for an operator to disconnect the LCD 280 from the I/O circuit 222 of the board 220, and there is no need for an operator to actuate movement of the board 220 from the present testing device 260 to a next testing device 260 (not shown) for checking another function of the LCD 280. Furthermore, once the board 220 has arrived at the next testing device 260, the second connector 265 thereof is automatically connected to the first connector 225 for checking of the other function of the LCD 280. Thus there is no need for an operator to connect the LCD 280 with the I/O circuit 222 again. As a result, the efficiency of testing of the LCDs 280 using the automatic testing apparatus 200 is high.

It is to be understood, however, that even though numerous characteristics and advantages of preferred embodiments have been set out in the foregoing description, together with details of the structures and functions of the embodiments, the disclosure is illustrative only, and changes may be made in detail, especially in matters of shape, size, and arrangement of parts within the principles of present invention to the full extent indicated by the broad general meaning of the terms in which the appended claims are expressed.

What is claimed is:

1. An automatic testing apparatus comprising:
a transmission floor having a plurality of rollers positioned at two sides thereof;
a board positioned on the rollers, the board comprising an I/O (input/output) circuit for electrically connecting to a device to be tested, and a first connector electrically connected to the I/O circuit;
a stopping unit positioned at the transmission floor; and
a testing device positioned beside the transmission floor, the testing device comprising a second connector matable with the first connector;
wherein the second connector is configured to move and connect with the first connector and thereby form a plurality of signal channels in cooperation with the first connector; the first connector comprises a plurality of metal pads arranged in an array, and the second connector comprises a plurality of metal probes arranged in an array corresponding to the array of the first connector;
wherein a first positioning mechanism is used to adjust the position of the second connector relative to the first connector,
wherein the first positioning mechanism comprises a positioning post a with tapered bottom end provided with the second connector, and a positioning hole corresponding to the positioning post provided with the first connector, a diameter of the positioning hole being slightly greater than a diameter the positioning post; and the positioning post is longer than the metal probes; and
wherein the second connector further comprises a first air driven device configured for moving the metal probes to connect with the metal pads of the first connector, and the second positioning mechanism comprises a second air driven device having a positioning head, the second air driven device being configured for moving the positioning head and thereby adjusting a position of the board relative to the testing device.

2. The automatic testing apparatus as claimed in claim 1, where a distance between the positioning head of the second positioning mechanism and the stopping unit is greater than a corresponding width of the board.

3. The automatic testing apparatus as claimed in claim 1, further comprising a detecting unit configured for generating a detecting signal according to a position of the board at the testing device, and the testing device is configured for controlling actions of the first air driven device, the second air driven device, and the stopping unit according to the detecting signal and a result of testing of the device to be tested generated by the testing device.

4. The automatic testing apparatus as claimed in claim 3, wherein the detecting unit is an optical sensor.

5. The automatic testing apparatus as claimed in claim 4, wherein the testing device comprises a display device used to show a status of a testing procedure and the testing result.

* * * * *